United States Patent [19]

Varshney

[11] Patent Number: 4,495,603
[45] Date of Patent: Jan. 22, 1985

[54] TEST SYSTEM FOR SEGMENTED MEMORY

[76] Inventor: Ramesh C. Varshney, 2622 Ohlone Dr., San Jose, Calif. 95132

[21] Appl. No.: 174,112

[22] Filed: Jul. 31, 1980

[51] Int. Cl.³ .............................................. G11C 7/00
[52] U.S. Cl. ..................................... 365/233; 365/201
[58] Field of Search ............... 365/201, 189, 230, 239, 365/200; 371/21, 24, 25

[56] References Cited

U.S. PATENT DOCUMENTS

| | | | |
|---|---|---|---|
| 3,311,890 | 3/1967 | Waaben | 371/25 |
| 3,336,579 | 8/1967 | Heymann | 365/201 |
| 3,845,476 | 10/1974 | Boehm | 365/200 |
| 4,061,908 | 12/1977 | de Jonge | 365/201 |
| 4,122,540 | 10/1978 | Russell et al. | 365/200 |

Primary Examiner—James W. Moffitt
Attorney, Agent, or Firm—Harry M. Weiss

[57] ABSTRACT

A semiconductor memory system is organized into a plurality of segments and is equipped with multiplexed or multifunctional pin for input/output purposes; e.g. the memory address pins, since there is a portion of each memory cycle during which the logic state of the address pins is unimportant. Logic means is provided for coupling the multiplexed pins to the memory segments through the input/output lines upon the occurrence of a test clock signal. The test clock signal is generated during the don't-care portion of the memory cycle.

28 Claims, 12 Drawing Figures

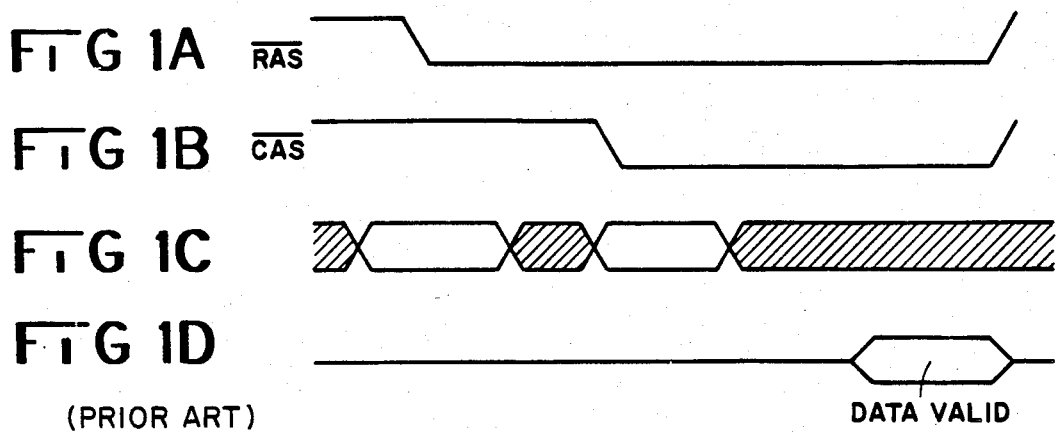
FIG 1A $\overline{RAS}$
FIG 1B $\overline{CAS}$
FIG 1C
FIG 1D
(PRIOR ART)
DATA VALID
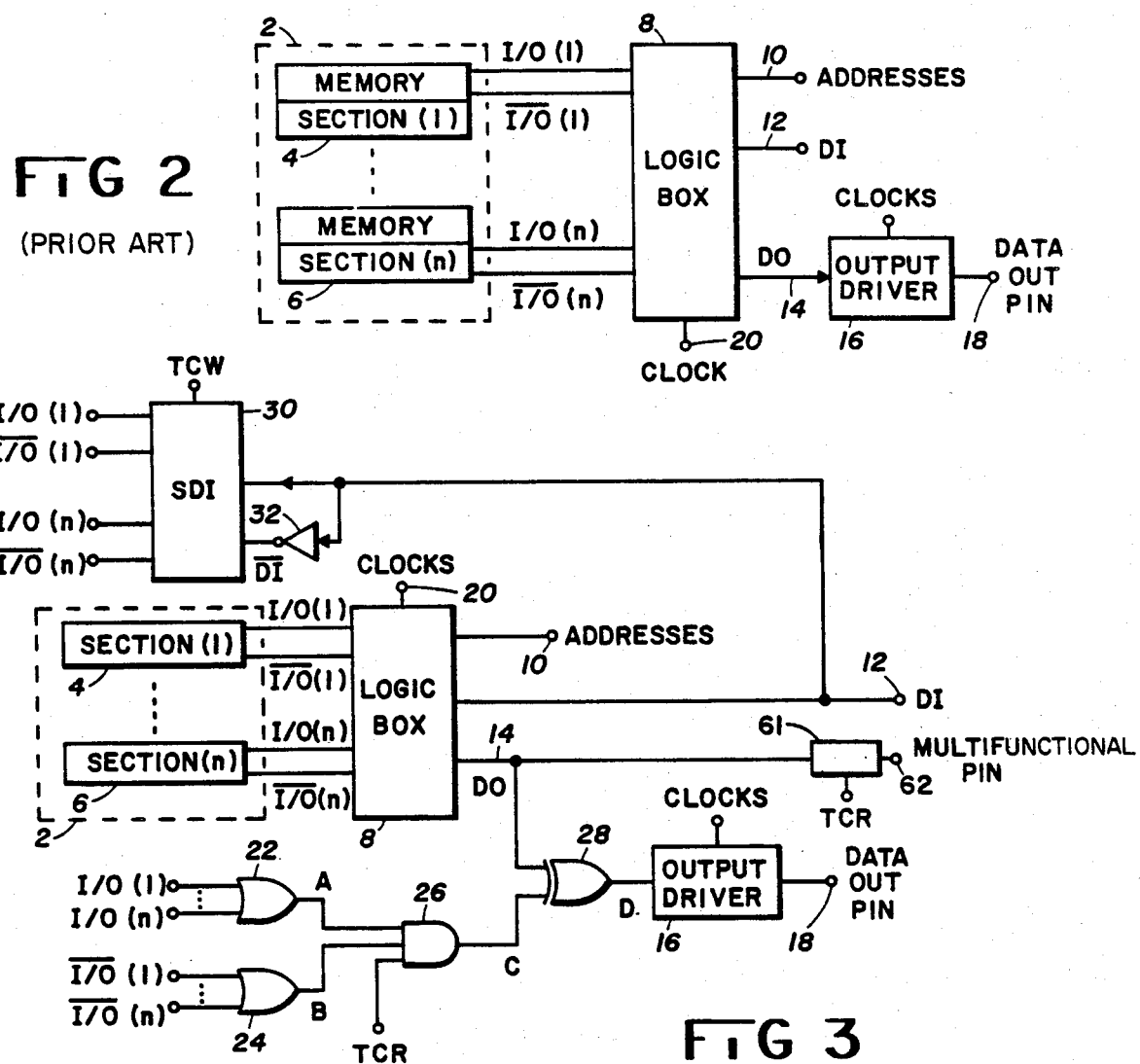
FIG 2 (PRIOR ART)
FIG 3

TEST SYSTEM FOR SEGMENTED MEMORY

BACKGROUND OF THE INVENTION

1. Field of the Invention

This invention relates generally to memory systems, and more particularly to a semiconductor memory organized into several segments.

2. Description of the Prior Art

Advancements in manufacturing equipment and know-how has reduced considerably the manufacturing costs of integrated circuit semiconductor chips. However, each new generation of random access memories (RAMs), due to their greater complexity and density, requires substantial increases in test times.

A memory comprised of $N \times 1$ bits is capable of storing as many as $2^N$ different data patterns. It would not be practical to use $2^N$ data patterns to test the memory; however, judicious application of product knowledge and test experience will result in the development of a short but effective test method.

A simple pattern (e.g. a checkerboard pattern) requires a minimum test time of 2N cycles, N cycles for writing and N cycles for reading. However, simple data patterns (e.g. checkerboard, solid ones, solid zeros) may not effectively test the memory.

With the increase in memory chip density and decrease in memory cell size and the corresponding reduction in margins, it has become increasingly important that a memory bit be tested not only under the influence of nearby bits but also under the influence of data patterns in other memory segments. Generally, test time (t) is defined by:

$$t = KN^x \qquad (1)$$

where K is a constant, N is the memory density and x is a positive number greater than one. Thus, the test time associated with dynamic RAMs increases far more rapidly than does their density. As a result, the costs associated with the testing of semiconductor memories now represents a significant portion of the total manufacturing cost.

One method of reducing test cost involves organizing the memory chip with multiple input and output pins so as to permit simultaneous testing of several sections of the memory. This, however, increases pin count which increases the cost of the package and associated assembly cost and reduces memory board density, increasing overall memory system cost.

SUMMARY OF THE INVENTION

It is an object of the present invention to provide an improved memory system.

It is a further object of the invention to provide an improved semiconductor memory system which, due to its organization and design, has greater flexibility and reduced test times.

Finally, it is an object of the present invention to provide a semiconductor memory chip having a reduced test time without a corresponding increase in pin count.

According to a first aspect of the invention there is provided a memory system comprising, a memory divided into a plurality of memory segments or sections; first logic means coupled to each of said plurality of segments, said first logic means for writing data into said memory and reading data out of said memory, a plurality of input/output lines for coupling said first logic means to said memory and time multiplexing or multifunctional means coupled to said plurality of input/output lines for writing data into and reading data from said memeory segments during a predetermined portion of a memory cycle.

According to a further aspect of the invention there is provided a memory system of the type wherein a plurality of memory segments are coupled via a plurality of input/output lines to circuitry which receives addresses for writing data into and reading data from said memory, and wherein a plurality of address pins are provided for externally accessing said memory, comprising a source of a test clock signal and a plurality of time multiplexing or multifunctional means coupled between said plurality of input/output lines and plurality of time multiplexed pins, said plurality of time multiplexing or multifunctional means being responsive to said test clock signal for coupling each of said segment to a different one of said mulitplexed pins for accessing each of said segments independently wherein each of said time multiplexing or multifunctional means includes a bidirectional switch.

According to a still further aspect of the invention there is provided a memory system wherein each of said multifunctional means includes a bidirectional switch wherein said bidirectional switch comprises first and second three-state buffer circuits responsive to said read test clock and said write test clock respectively.

The above and other objects, features and advanatages of the present invention will be more clearly understood from the following detailed description taken in conjunction with the accompanying drawings, in which:

BRIEF DESCRIPTION OF THE DRAWINGS

FIGS. 1A-1D show waveform diagrams illustrating typical read cycle timing for a dynamic RAM;

FIG. 2 is a block diagram showing a prior art memory organization;

FIG. 3 is a block diagram of the memory system according to the present invention;

DESCRIPTION OF THE PREFERRED EMBODIMENT

Figure 4A:
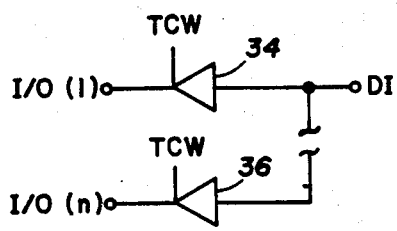
FIGS. 4A and 4B illustrate possible implementations of the SDI switch of FIG. 3.

The invention resides in the use of one or more multifunctional pins for input/output (I/O) functions in conjunction with a memory which is organized into several segments or sections. These pins may be the memory address pins since there is a portion of each memory cycle wherein the state (high or low) on the address pins is not important or a "Don't Care" state.

FIGS. 1A-1D are waveforms which illustrate typical read-cycle timing of a dynamic RAM (e.g. Mostek's 16384×1 bit dynamic RAM bearing part number MK 4116P-2/3). FIGS. 1A and 1B illustrate the row address select and column address select signals, respectively. The cross-hatched portions of FIG. 1C correspond to the times when the address pins are effectively in the "don't care" state; i.e. they may be used in a test mode or in a different memory organization mode to read data from and write data into different segments of the memory. FIG. 1D illustrates the appearance of data on the memory's I/O lines.

FIG. 2 is a block diagram of a prior art memory organization. A semiconductor memory 2 is shown as being divided into n segments with the first segment designated 4 and the nth segment designated 6. The memory is coupled to a logic box 8 via input/output lines I/O(1), $\overline{I/O(1)}$ to I/O(n), $\overline{I/O(n)}$. As can be seen, logic box 8 includes means for receiving address signals on input 10 and clock pulses on input 20, means for receiving input data (DI) on input 12 and means for transmitting output data (Do) on lead 14 to output driver 16 which receives clock signals and feeds a data-out pin 18.

FIG. 3 is a block diagram of a semiconductor memory system according to one embodiment of the present invention. Those portions of FIG. 3 which are shown in FIG. 2 are denoted with like reference numerals. It can be seen that lines I/O(1) to I/O(n) form inputs to a first logical OR gate 22 and that lines $\overline{I/O(1)}$ to $\overline{I/O(n)}$ form inputs to a second logical OR gate 24. The outputs of OR gates 22 and 24 form first a logical and second inputs to AND gate 26. A read test clock RTC forms the third input to AND gate 26. The output of AND gate 26 is coupled to a first input of exclusive OR gate 28, and the data out (Do) from logic box 8 is coupled to the second input of gate 28, the output of which is coupled to an input of output driver 16.

The data out (Do) lead 14 from the logic box 8 is coupled to an input of the new logic box 61. The output of logic box 61 is coupled to a multifunctional pin 62. The multifunctional pin 62 may be an address pin or data in pin or some other pin of the memory. The important property of the multifunctional pin 62 is that its logic state (high or low) is not important during a portion of each memory cycle.

The logic box 61 may be a multifunctional switch which couples the data out (Do) from output 14 to the selected segment of a multifunctional pin 62 upon the occurrence of read test clock RTC. The logic box 61 may be implemented by a field-effect-transistor switch such as the single transistor 50 of FIG. 6A, as hereinafter described. The source and drain of such a transistor are coupled to the data out signal (Do) and multifunctional pin 62 while its gate is coupled to read test clock RTC.

Figure 6A:
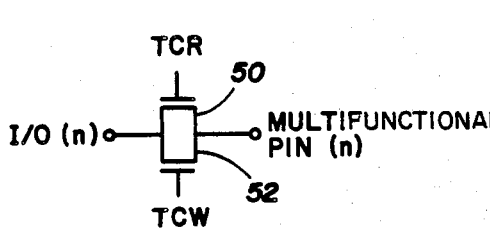
FIGS. 6A and 6B illustrate further the embodiment shown in FIG. 5.
Figure 6B:
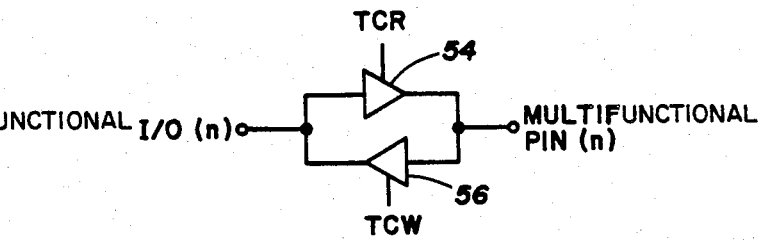

The logic box 61 may be implemented by a three-state buffer such as buffer 54 of FIG. 6B. The input of such a buffer is coupled to data out (Do) and the output of the buffer is coupled to the multifunctional pin 62. The output of the three-state buffer is in the high impedance state except when RTC is active.

Figure 4B:
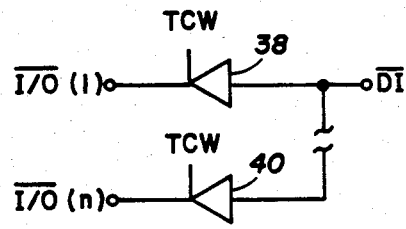

The data-in (DI) signal is coupled to a first input of data-in switch SDI 30 and to a second input thereof via inverter 32. A write test clock (WTC) is received by switch 30 for coupling the input data to the I/O lines labeled (DI to I/O(1)-(I/O(n) and $\overline{DI}$ to I/O(1)-I/O(n)). The SDI switch 30 may be implemented as shown in FIGS. 4A and 4B wherein the above described coupling is accomplished with three-state buffers 34, 36 and 38, 40. The outputs of the three-state buffer circuits in FIGS. 4A and 4B are at a high impedance state (the switch is off) except when WTC is on.

Clocks WTC and RTC are test clocks or clock pulses or signals which are generated during write and read cycles, respectively, or during write time and read time, respectively, in case of a read modify write cycle. Referring back to FIG. 3, the selected memory section is generally read from and written into via logic box 8. When a special test is required, the input/output signals on I/O(1)-I/O(n) and $\overline{I/O(1)}$-$\overline{I/O(n)}$ are coupled to exclusive-OR gate 28 through gates 22, 24 and 26 and the data out (Do) lead 14 is coupled to multifunctional pin 62 through logic box 61 permitting unchanged data from (Do) to appear on pin 62 upon the occurrence of RTC. The output of gate 28 feeds output driver 16. Similarly, during a write-cycle, the generation of WTC will permit data to be written into each section of the memory. The same data is written into all memory sections (1) through section (n). During a read mode, if the data stored in the memory sections has not been changed, then the output of one of the OR gates (22 or 24) will be a logical zero or a "low" causing the output of AND gate 26 to be a logic zero. This gate output is applied to a first input of exclusive OR gate 28 which permits the data applied to the second input of gate 28 to pass unchanged to the output driver. If one or more (not all) memory sections are bad, then both OR gates 22 and 24 will yield a logic one causing the signal applied to the second input of exclusive OR gate 28 to be inverted.

If all of the memory sections are bad then the output of one of the OR gates (22 or 24) will be logic zero causing the output of AND gate 26 to be a logic zero. This will cause the bad data from the selected block to pass through gate 28 unchanged to the output driver 16 and bad data will appear on both of the pins 18 and 62. Thus, in all cases, the outputs on pins 18 and 62 are good only when data read from all memory sections corresponds to what was written. If not, the output read from one or both the pins 18 and 62 will be changed.

It should be noted that the same kind of testing may be accomplished by interchanging the inputs of the output driver 16 and the logic box 61. In this case the output pin 18 will always receive unchanged data from the selected section while, upon the occurrence of the read test clock, the multifunctional pin 62 will receive changed or unchanged data depending upon the memory being all good, all bad or partially good.

Figure 5:
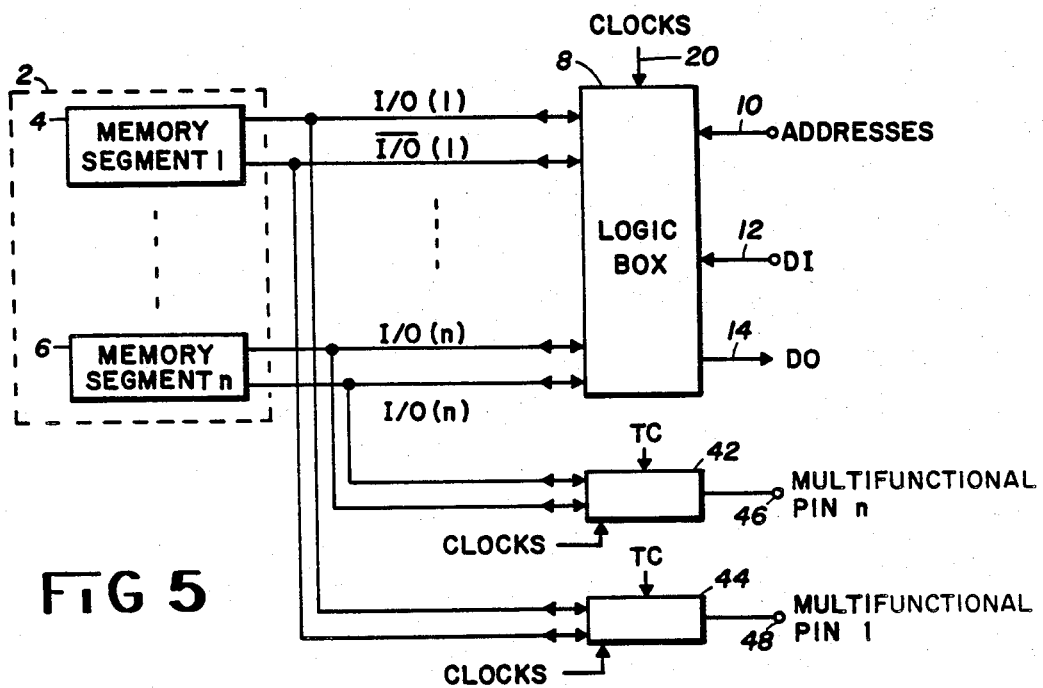
FIG. 5 is a block diagram of a second embodiment the memory system of the present invention.

The system shown in FIGS. 3 and 5 are applicable to bipolar, MOS, and CCD memories.

FIG. 5 is a block diagram of a second embodiment of the inventive semiconductor or semiconductor chip memory system with like reference numerals denoting like elements. Again, the memory 2 is divided into "n" segments (1) through (n). The system in FIG. 5 includes "n" new logic boxes such as 42 and 44 each of which is coupled to one of the multifunctional address pins; i.e. box 42 is coupled to pin n(46), and box 44 is coupled to pin 1(48). As can be seen, new logic box 42 is coupled to lines $I/O_{(n)}$ and $\overline{I/O(n)}$, and new logic box 44 is coupled to lines I/O(1) and $\overline{I/O(1)}$. Each of the new logic boxes may receive all the clock signals received by logic box 8. In addition, new logic boxes 42 and 44 receive the above described test clocks TC; i.e. (RTC) and (WTC) which occur during the "don't care" portions of FIG. 1C.

The new logic boxes 42 and 44 may be bidirectional switches which connect the address (multifunctional) pin to the I/O buses during a test clock signal which occurs when the state of the multifunctional pins is not important; i.e. during the "don't care" states of the write or read cycles. FIGS. 6A and 6B illustrate two of the suitable logical implementations of logic boxes 42 and 44. The arrangement shown in FIG. 6A is suitable for MOS or CCD memories and comprise first and second field-effect-transistors 50 and 52 having their source-drain path coupled in parallel between a multifunctional pin and one of the I/O lines. The gate electrodes of FETs 50 and 52 are coupled, respectively, to a read-test-clock (RTC) and a write-test-clock (WTC). Thus, the multifunctional pin is coupled to the I/o line during the occurrence of either (RTC) or (WTC).

New logic boxes 42 and 44 may be implemented with the three-state buffer circuits 54 and 56 as shown in FIG. 6B. The outputs of buffers 54 and 56 are at a high impedance state except when (RTC) and, (WTC) respectively, are active. When either RTC or (WTC) become active, the multifunctional pin is coupled to the I/O line.

Figure 7:
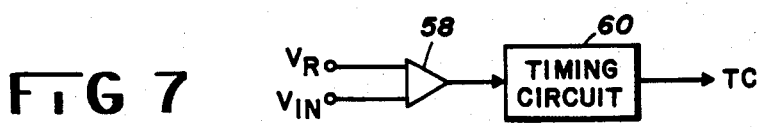
FIG. 7 illustrates a block diagram of a circuit for generating test clock signals.

The test clock may be supplied externally or may be generated by one or more input signals having voltage amplitudes corresponding to a third logical voltage level. Such use of a third logical voltage level at a pin is common in electronically-programmable read-only memories (EPROMs). The test clock may also be generated by skewing two or more signals with respect to each other such that the skewed timing does not correspond to normal operation of the memory. The test clock may be generated by the circuitry shown in FIG. 7, which includes a comparator 60 having a first input $V_R$ and a second input Vin. Vin may be a column select signal ($\overline{CAS}$), a row select signal ($\overline{RAS}$), a write-read signal, a chip-select or a clock signal used in the memory system. Signal $V_R$ is a reference voltage and can be a d.c. voltage or a clock voltage while Vin is an input signal. If Vin should exceed $V_R$ or fall below $V_R$ by a significant amount (usually equal to the threshold voltage $V_T$ for MOS comparators, then the output of the comparator becomes active. If the Vin signal is to be negative, the $V_R$ may be at ground potential. If the Vin signal is to be positive, the $V_R$ may be the highest voltage on the chip (e.g. $V_{DD}$) i.e. $V_R$ is one of the voltage limits (high or low) of Vin for the normal operation of the memory. The output of the comparator passes through a timing chain 58 to assure that the test clock pulse occurs only during the above-referred to "don't care" states.

Using the arrangements shown in FIGS. 3 and 5, the time it takes to test semiconductor memories is substantially reduced without increasing pin count. Further, the memory organization may be varied if desired; i.e. an N×1 memory may be used as an (N/n)×n memory where n is the number of memory segments and multiplexed pins. Thus, the memory depth can be reduced. The use of different test patterns in different segments permits evaluation of the sensitivity of interaction of different segments.

By adding a fuse in the comparator of test clock generator, one can change the memory organization permanently by blowing a fuse TC or by shorting a link. In such a case, the test clock TC is always generated without the need for a third voltage level input signal and the memory is always used as (N/n)×n. If the fuse is not blown then the memory stays an N×1 organized memory but is converted to (N/n)×n whenever the Vin signal is brought higher or lower than $V_R$ depending upon design convenience.

In this way one memory serves two purposes. It can be marketed and used as (N/n)×n organized memory or can be used as N×1 memory but may be tested as (N/n)×n memory.

While the invention has been particularly described and shown in reference to the preferred embodiments thereof, it will be understood by those skilled in the art that various changes in form and detail and omissions may be made therein without departing from the spirit and scope of the invention.

I claim:

1. A memory system, comprising:
   a memory divided into a plurality of memory segments;
   first logic means operatively coupled to each of said plurality of a memory segments, said first logic means for writing data into said memory and reading data from said memory;
   a plurality of input/output lines for operatively coupling said first logic means to said plurality of memory segments; and
   multifunctional means operatively coupled to said plurality of said input/output lines for writing data into and reading data from said memory segments during a predetermined "don't care" portion of a memory cycle, each of said plurality of input/output lines being operatively coupled to one of said plurality of memory segments.

2. The memory system according to of claim 1 wherein said multifunctional means comprises:
   a source of test clock signals including timing means for insuring that said test clock signals are output only during the "don't care" phase of the memory cycle; and
   a multifunctional output pin; and
   a bidirectional switching means having a first terminal operatively coupled to a selected one of said plurality of input/output lines and a second terminal operatively coupled to an said multifunctional output pin, said bidirectional switching means being responsive to at least one of said test clock signals for coupling said multifunctional output pin to said selected one of said plurality of input/output lines whereby the memory segment associated with said selected one of said plurality of input/output lines maybe individually accessed through said logic means.

3. The memory system of claim 2 further including means responsive to said test clock signals for at least temporarily converting said memory system from an N×I memory into an(N/n)×n memory for testing purposes and without increasing the pin count of said memory.

4. The memory system of claim 2 further including means for receiving an externally generated test clock signals.

5. The memory system of claim 2 further including means for generating said test clock signals.

6. The memory system of claim 5 wherein said test clock signals are generated from a third logical voltage level input signal produced whenever a conventional memory system signal having a first logical voltage level has an amplitude which is less than a second logical voltage level established by a specified reference voltage.

7. The memory system of claim 5 wherein said test clock signals are generated from a third logical voltage level input signal whenever a conventional memory system signal having a first logical voltage level has an amplitude greater than a second logical voltage level established by a specified reference voltage.

8. The memory system of claim 2 wherein said test clock signals include a read test clock during which data is read from said memory segments and a write test clock during which data is read into said memory segments, said read test clock and said write test clock being generated only during a "don't care" portion of the memory cycle.

9. The memory system of claim 8 wherein said bidirectional switch comprises first and second field-effect-transistors having their current-conductive paths coupled in parallel, the gate of said first field-effect-transistor being coupled to said write test clock and the gate of said second field-effect-transistor being coupled to said read test clock.

10. The memory system of claim 8 wherein said bidirectional switch comprises first and second three-state buffer circuits responsive to said read test clock and said write test clock a respectively.

11. A memory system of the type wherein a plurality of memory segments are coupled via a plurality of input/output lines to circuitry which receives addresses for writing data into and reading data from said memory, and wherein a plurality of address pins are provided for externally accessing said memory, said address pins being such that the logical state of the signal thereon does not matter during a predetermined "don't care" portion of the normal memory cycle, comprising:
a source of test clock signals generated only during said "don't care" portion of the memory cycle; and
a plurality of multifunctional means each including bidirectional switching means operatively coupled between said plurality of input/output lines and a corresponding one of a plurality of said address pins, said plurality of bidirectional switching means being responsive to said test clock signals for opeatively coupling each of said memory segments to a different one of said address pins for accessing each of said memory segments independently.

12. The memory system of claim 11 wherein said test clock signals are generated from a third logical voltage level signal whenever a conventional memory system signal having a first logical voltage level has an amplitude at least one of greater and less than a second logical voltage level established by a predetermined reference voltage.

13. The memory system of claim 11 wherein said test clock signals includes a read test clock signal during which data is read from said addressed memory segment and a write test clock during which data is written into said memory segments.

14. The memory system of claim 11 wherein said bidirectional switching means comprises first and second field-effecttransistors each having their current conductivity paths coupled in parallel, the gate of said first field-effect-transistor being coupled to said write test clock and the gate of said second field-effect-transistor being coupled to said read test clock.

15. The memory system of claim 11 wherein said bidirectional switching means comprises first and second three-state buffer circuits responsive to said read test clock and said write test clock, respectively.

16. A memory system of claim 11 wherein the logical state of the signal on said address pins does not affect the memory operation during at least said "don't care" portion of the memory cycle.

17. A method for testing a memory wherein said memory is divided into a plurality of memory segments, said memory having a memory cycle, at least a portion of said memory cycle including a "don't care" state, said memory including a data out terminal, said method comprising:
writing the same data pattern into each of said memory segments;
reading the data written into each of said plurality of memory segments, said writing and reading occurring only during said predetermined "don't care" portion portions of a said memory cycle and effected by said multifunctional directional control means; and
comparing the data read from each memory segment; and
the signals at said data out terminal and resulting from said comparing steps producing unchanged data only if all data read from said memory corresponds exactly to what was written into said memory.

18. The method of claim 17 further comprising the steps of:
passing data unchanged to said data out terminal if data read from each segment compares; and
inverting data at said data out terminal if data read from each segment does not compare.

19. A method of claim 18 wherein the step of writing said data patterns including writing into each of said memory segments simultaneously.

20. The method for testing a $N \times 1$ memory of claim 17 including the steps of dividing said memory into "n" memory segments; and temporarily changing said memory by programming means from an $N \times 1$ array into an $(N/n) \times n$ array for test purposes only and without increasing pin count.

21. A memory system, comprising:
a semiconductor memory divided into a plurality of a memory segments;
logic means operatively coupled to each of said plurality of memory segments, said logic means including a data-out terminal;
a plurality of input/output lines for operatively coupling said logic means to said plurality of memory segments;
means for generating at least first and second test clock signals;
writing means responsive to said first test clock signal for writing the same test data pattern into each of said plurality of memory segments; and
reading means responsive to said second test clock signal for reading stored data out of said plurality of memory segments;
comparison means for comparing the data read from each memory segment with the data written into said memory segment and generating comparison signals depending on whether all, some or none of the read data is unchanged;
multifunctional means including an output pin and said multifunctional means being responsive to said second test clock signal for supplying unchanged data from the data out terminal of said logic means to said output pin; and
output driver means including a second data out pin and means responsive to said second test clock signal and to said comparison signals for operatively coupling said data out terminal to said data out pin so as to enable said first and second pins to be monitored for testing said memory segments.

22. The memory system of claim 21 further comprising means for inverting data appearing at said data out terminal if the data read from said plurality of segments does not compare.

23. The memory system of claim 22 wherein said comparing means includes logical OR state means having inputs coupled to said plurality of input/output lines and having an output.

24. The memory system of claim 23 wherein said inverting means includes an exclusive-OR circuit having a first input coupled to said output and having a second input coupled so to said data out terminal.

25. The memory system of claim 23 wherein said logical OR gate means includes at least first and second logical OR gates, each having multiple inputs and an output, each of the inputs of said first logical OR gate being operatively coupled to a non-inverting one of said plurality of input/output lines coupling said plurality of memory segments and said second logical OR gate having its plurality of inputs operatively coupled to the inverting ones of said plurality of said input/output lines coupling said pluarlity of memory segments such that when none of the stored data has been changed, the output of one said first and second OR gates is "low;" if one or more but not all of said memory segments are bad, then the output of both said first and second OR gates is "high," and if all of the memory sections are bad, then the output of one of said first and second logical OR gates will be "low;"

said comparing means further includes a logical AND gate having three inputs and an output, one input of said AND gate being directly coupled to the output of said first logical OR gate, second input of said AND gate being directly coupled to the output of said second logical OR, said third input of said AND gate being operatively coupled to receive at least one of said first and second test clock signals, the output of said logical AND gate going high when the output of both logical OR gates is high and going low when the output of either said first and second OR gates is low;

said inverting means includes an Exclusive-OR circuit having first and second inputs and an output, said first input being operatively coupled to the data out terminal of said logic means, said second input being operatively coupled to the output of said logical AND gate, and said Exclusive-OR output being coupled to a multifunctional pin, the high or low signal present at said second Exclusive-OR input gateing said memory signal read from said data out terminal of said logic means such that data present at such multifunctional pin and said data out terminal are unchanged only when the data read from all memory sections corresponds to that which was written into all memory sections.

26. N×1 semiconductor memory system which can be divided into "n" individually addressable memory segments and which is adapted to be used as an N×1 memory array but tested as an (N/n)×n memory for significantly reduced testing times without an increase in the overall pin count, wherein said memory operates on a memory cycle having at least one "don't care" portion contained therein, said memory system comprising:

a source of address commands;
means for generating test clock signals during the "don't care" portions of said memory cycle, said test clock signals including at least a write test clock signal WTC and a read test clock signal RTC;

first logic means responsive to said address commands for writing into said memory segments whenever said WTC signal is generated and for reading out of said memory segments whenever said RTC signal is generated, said logic means having a data output;

a plurality of externally accessible address pins and a data out pin, the logic state of the signal on said pins being unimportant during at least the "don't care" portion of the memory cycle;

a plurality of "n" I/O addressable lines and a plurality of "n" I/O operatively coupled between said logic means and the individually accessible "n" memory segments;

a multifunctional pin;

means operably coupling the data output of said logic means and said multifunctional pin, said means being responsive to said RTC signal for transmitting unchanged data from the data output of said logic means to said multifunctional pin; and second logic means operably coupled between said I/O lines and said data out pin and responsive to said test clock signals and said data out signal for outputting unchanged data at both said data out pin and said multifunctional pin only when all data read from all memory segments corresponds to all data written into all memory segments and for changing the signal present at one of said pins as an indication that one or more memory errors have been detected.

27. The memory system of claim 26 wherein said second logic means includes a first gating means responsive to the signals on said n lines for generating a first enabling signal whenever all memory segments are good and when all memory segments are bad and a disable signal whenever at least one but not all of said memory segments are bad; and second gating means properly coupled to said data output terminal of said logic means and responsive to said enable signal for transmitting said data out signal to said data output pin and to said disable signal for inverting the data out signal for transmission to said data out pin such that the signal present at both the data output pin and said multifunctional pin are both unchanged only if all data read from all memory segments is the same as that written therein.

28. The memory system of claim 27 wherein said first gating means includes a first logical OR gate having n inputs, one for each of the non-inverting states of the n memory segments and a first OR gate output;

a second logical OR gate having n inputs, one for each of the n inverting states of the n memory segments, and a second OR gate output;

a first logical AND gate having one input operatively coupled to the output of said first OR gate, a second input operatively coupled to the output of said second OR gate, and a third input operatively coupled to receive said RTC signal, said AND gate having an output for passing and enabling signal to said second gating means whenever either of the first and second logical OR gates detect the absence of memory errors or all memory sections are bad and a disable signal whenever either of said OR gates detects that one or more memory sections are bad.

* * * * *